(12) United States Patent
Hiramatsu

(10) Patent No.: US 6,590,373 B2
(45) Date of Patent: Jul. 8, 2003

(54) REGENERATIVE LOAD APPARATUS AND LOAD TEST METHOD

(75) Inventor: Tamihei Hiramatsu, Kanagawa (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 10/174,005

(22) Filed: Jun. 17, 2002

(65) Prior Publication Data

US 2003/0062884 A1 Apr. 3, 2003

(30) Foreign Application Priority Data

Jun. 28, 2001 (JP) .......................................... 2001-197149

(51) Int. Cl.[7] ................................................ H01F 30/12
(52) U.S. Cl. ...................................................... 323/361
(58) Field of Search ................................. 323/328, 346, 323/355, 361; 307/11, 17, 31, 36–39

(56) References Cited

U.S. PATENT DOCUMENTS 5,684,383 A * 11/1997 Tsuji et al. ...................... 320/5
5,808,880 A * 9/1998 Marvin ........................ 363/37
6,377,478 B1 * 4/2002 Morishita .................... 363/34

* cited by examiner

Primary Examiner—Matthew Nguyen
(74) Attorney, Agent, or Firm—Reed Smith Crosby Heafey LLP

(57) ABSTRACT

A regenerative load apparatus and a load test method are able to reduce a test cost required when a load test is effected on apparatus for supplying electric power to a load. The regenerative load apparatus includes a first load (22) for transmitting supplied electric power at a current conversion ratio approximately inverse relative to that of a tested apparatus (21) from an output side, a second load (23) for consuming supplied electric power and a power supply (24) for supplying electric power approximately equal to electric power consumed by the second load (23) to the tested apparatus (21), wherein electric power is diverged and supplied to the first load (22) and the second load (23) from the tested apparatus (21) and the electric power transmitted from the first load (22) is supplied to the tested apparatus (21) in addition to the electric power from the power supply 24.

15 Claims, 3 Drawing Sheets

REGENERATIVE LOAD APPARATUS AND LOAD TEST METHOD

BACKGROUND OF THE INVENTION

1. Field of the Invention

The present invention relates to an apparatus for and a method of effecting a load test on an apparatus such as a power supply apparatus or a power amplifier for supplying electric power to a load.

2. Description of the Related Art

When a load test is effected on an apparatus such as a power supply apparatus or a power amplifier for supplying electric power to a load, a load test is executed in such a manner that an apparatus to be tested is connected to a load apparatus as a substitute for an actual load.

In the above-mentioned load test, resistors and semiconductors have been used as a load apparatus so far.

Since, however, resistors and semiconductor consume all of electric power and convert it to produce heat, the above-mentioned related-art load test entails the following shortcomings (a) and (b).

(a): Since all of electric power supplied from a tested apparatus to a load apparatus is consumed by the load apparatus, not only electric power consumed by the tested apparatus itself but also electric power supplied from the tested apparatus to the load apparatus should be supplied to the tested apparatus by a suitable means such as a commercially-available power supply. For this reason, electric charges increase unavoidably so that the load test becomes expensive.

(b): In order to prevent temperature from rising within facilities due to heat produced from the load apparatus, a load test should be performed within the facilities of wide space or the load test should be performed while air-conditioning facilities or cooling apparatus are being operated. Moreover, in order to prevent the load apparatus from being damaged due to heat produced by the load apparatus itself, the load apparatus should be made large in size (surface area of the load apparatus should be widened in order to efficiently diverge heat). As a consequence, from these standpoints, the tested apparatus and the test method become expensive and preparations for the load test become cumbersome.

The above-mentioned shortcomings become remarkable particularly when the tested apparatus is an apparatus which outputs a large output current or particularly when a load test may be executed for a long period of time so as to examine aging changes of the tested apparatus.

SUMMARY OF THE INVENTION

In view of the aforesaid aspect, it is an object of the present invention to provide a regenerative load apparatus and a load test method in which the shortcomings encountered in the related art when a load test is effected on an apparatus such as a power supply apparatus or a power amplifier for supplying electric power to a load can be removed.

It is another object of the present invention to provide a regenerative load apparatus and a load test method in which a test cost required when a load test is effected on an apparatus for supplying electric power to a load can be decreased considerably.

According to an aspect of the present invention, there is provided a load apparatus for testing an apparatus, which supplies electric power to a load, as a tested apparatus. This regenerative load apparatus is comprised of a first load for transmitting supplied electric power from an output side at a current conversion ratio approximately inverse relative to that of the tested apparatus, a second load for consuming supplied electric power and a power supply for supplying electric power to the tested apparatus as is approximately equal to electric power consumed by the second load, wherein electric power is diverged and supplied to the first and second loads from the tested apparatus and the electric power transmitted from the first load is supplied to the tested apparatus in addition to the electric power from the power supply. Specifically, electric power is regenerated from the first load to the tested apparatus.

According to this regenerative load apparatus, since the output current of the tested apparatus becomes considerably larger than an input current to the second load, electric power supplied from the tested apparatus to the regenerative load apparatus can become considerably larger than the electric power consumed by the second load. Therefore, most of the electric power supplied from the tested apparatus to the regenerative load apparatus except the electric power consumed by the second load can be regenerated from the first load to the tested apparatus.

Then, since the power supply apparatus supplies the electric power approximately equal to the electric power consumed by the second load to the tested apparatus, the electric power supplied from the power supply to the tested apparatus becomes considerably smaller than the electric power supplied from the tested apparatus to the regenerative load apparatus. Specifically, the electric power supplied from the power supply to the tested apparatus becomes considerably smaller than electric power supplied from a suitable means such as a commercially-available power supply when a load test is executed by a load apparatus using a resistor or a semiconductor.

As described above, since the electric power supplied from the power supply to the tested apparatus can be decreased considerably, the aforementioned shortcoming (a) encountered in the related art can be eliminated.

Further, since only part of the electric power supplied from the tested apparatus to the regenerative load apparatus is consumed by the regenerative load apparatus, the regenerative load apparatus produces heat which is less intensive than that of the related-art load apparatus due to consumption of electric power. Thus, the aforementioned shortcoming (b) encountered in the related art also can be removed.

According to another aspect of the present invention, there is provided a load apparatus for testing an apparatus, which supplies electric power to a load, as a tested apparatus. This regenerative load apparatus is comprised of a first load for transmitting supplied electric power from an output side and whose current conversion ratio can be varied, a second load for consuming supplied electric power, a power supply for supplying electric power to said tested apparatus and whose output voltage can be varied and a control means for controlling the current conversion ratio of the first load and the output voltage of the power supply in unison with each other, wherein electric power is diverged and supplied to the first and second loads from the tested apparatus and the electric power transmitted from the first load is supplied to the tested apparatus in addition to the electric power from the power supply.

According to this regenerative load apparatus, as described above, since the electric power supplied from the power supply to the tested apparatus can be decreased considerably, the aforementioned shortcoming (a) encountered in the related art can be eliminated.

Further, since only part of the electric power supplied from the tested apparatus to the regenerative load apparatus is consumed by the regenerative load apparatus, the regenerative load apparatus produces heat which is less intensive than that of the related-art load apparatus due to consumption of electric power. Thus, the aforementioned shortcoming (b) encountered in the related art also can be eliminated.

Furthermore, according to this regenerative load apparatus, since the output current of the tested apparatus can be increased up to a desired target value by controlling the current conversion ratio of the first load and the output voltage of the power supply in unison with each other, a load test can be effected on a variety of tested apparatus.

According to still another aspect of the present invention, there is provided a load apparatus for testing an apparatus, which supplies electric power to a load, as a tested apparatus. This regenerative load apparatus is comprised of a first load for transmitting supplied electric power from an output side, a second load for consuming supplied electric power and whose equivalent resistance value can be varied, a power supply for supplying electric power to the tested apparatus and a control means for controlling the equivalent resistance value of the second load, wherein electric power is diverged and supplied to the first and second loads from the tested apparatus and the electric power transmitted from the first load is supplied to the tested apparatus in addition to the electric power from the power supply.

According to this regenerative load apparatus, as described above, since the electric power supplied from the power supply to the tested apparatus can be decreased considerably, the aforementioned shortcoming (a) encountered in the related art can be overcome.

Further, since only part of the electric power supplied from the tested apparatus to the regenerative load apparatus is consumed by the regenerative load apparatus, the regenerative load apparatus produces heat which is less intensive than that of the related-art load apparatus due to consumption of electric power. Thus, the aforementioned shortcoming (b) encountered in the related art also can be overcome.

Furthermore, according to this regenerative load apparatus, since the output current of the tested apparatus can be increased to a desired target value by controlling the equivalent resistance value of the second load, a load test can be effected on a variety of tested apparatus.

In the above-mentioned regenerative load apparatus according to the present invention, the first load is a switching power supply.

Further, in the above-mentioned regenerative load apparatus according to the present invention, the first load is a power amplifier.

According to a further aspect of the present invention, there is provided a method of effecting a load test on a tested apparatus which is an apparatus for supplying electric power to a load. This load test method is comprised of the steps of diverging and supplying electric power to a first load, which transmits supplied electric power from an output side, and a second load, which consumes supplied electric power, from the tested apparatus, supplying the electric power transmitted from said first load to the tested apparatus in addition to electric power from a power supply and controlling a current conversion ratio of the first load and an output voltage of the power supply in unison with each other.

According to this load test method of the present invention, as described above, since the electric power supplied from the power supply to the tested apparatus can be decreased considerably, the aforementioned shortcoming (a) encountered in the related art can be overcome.

Further, since only part of the electric power supplied from the tested apparatus to the regenerative load apparatus is consumed by the regenerative load apparatus, the regenerative load apparatus produces heat which is less intensive than heat of the related-art load apparatus due to consumption of electric power. Thus, the aforementioned shortcoming (b) encountered in the related art also can be overcome.

Furthermore, according to this load tested apparatus, since the output current of the tested apparatus can be increased up to a desired target value by controlling the current conversion ratio of the first load and the output voltage of the power supply in unison with each other, a load test can be effected on a variety of tested apparatus.

According to yet a further aspect of the present invention, there is provided a method of effecting a load test on a tested apparatus which is an apparatus for supplying electric power to a load. This load test method is comprised of the steps of diverging and supplying electric power to a first load, which transmits supplied electric power from an output side, and a second load, which consumes supplied electric power, from the tested apparatus, supplying the electric power transmitted from the first load to the tested apparatus in addition to electric power from a power supply and controlling an equivalent resistance value of the second load.

According to this load test method, as described above, since the electric power supplied from the power supply to the tested apparatus can be decreased considerably, the aforementioned shortcoming (a) encountered in the related art can be overcome.

Further, since only part of the electric power supplied from the tested apparatus to the regenerative load apparatus is consumed by the regenerative load apparatus, the regenerative load apparatus produces heat which is less intensive than that of the related-art load apparatus due to consumption of electric power. Thus, the aforementioned shortcoming (b) encountered in the related art also can be overcome.

Furthermore, according to this load tested apparatus, since the output current of the tested apparatus can be increased to a desired target value by controlling the equivalent resistance value of the second load, a load test can be effected on a variety of tested apparatus.

In the above-mentioned load tested apparatus according to the present invention, the first load is a switching power supply.

Further, in the above-mentioned load tested apparatus according to the present invention, the first load is a power amplifier.

DESCRIPTION OF THE PREFERRED EMBODIMENT

First, a fundamental principle of the present invention will be described.

Figure 1:
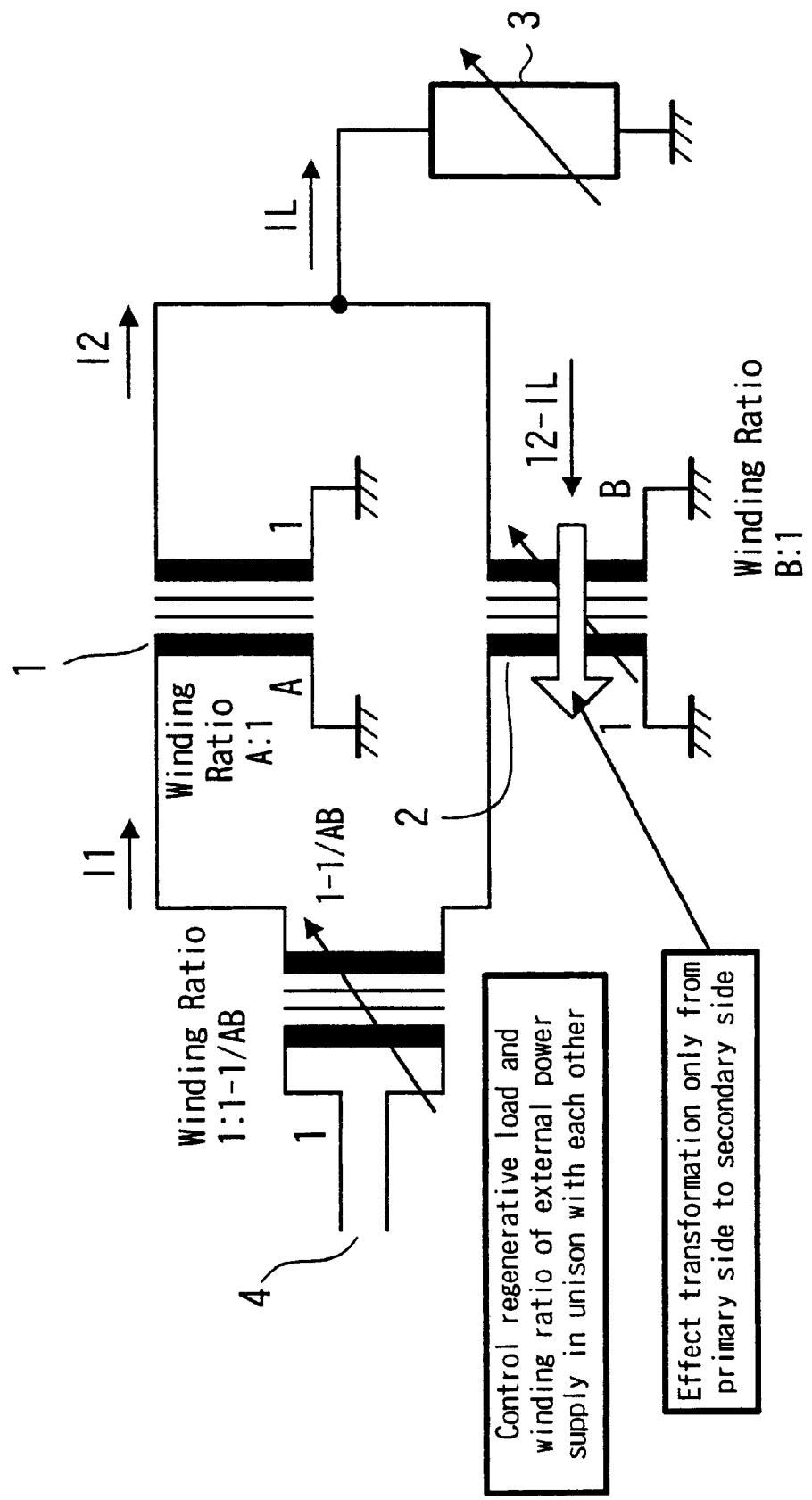
FIG. 1 is a schematic diagram for explaining the fundamental principle of the present invention.

FIG. 1 of the accompanying drawings is a schematic diagram showing a circuit arrangement in which a power supply apparatus serving as a tested apparatus, a first load within a regenerative load apparatus and a power supply are respectively likened to transformers and to which reference will be made in explaining the present invention. In FIG. 1, elements and parts other than a tested power supply 1 (tested apparatus) denoted as a transformer with a winding ratio of A:1 constitute a regenerative load apparatus.

As shown in FIG. 1, this regenerative load apparatus includes a regenerative load 2 (first load) denoted as an irreversible transformer having a winding ratio of B:1, a basic load 3 (second load) which consumes all of electric power supplied and a power supply 4 denoted as a transformer having a winding ratio $1:(1-1/A \cdot B)$. A voltage is applied to the primary side of the power supply 4 from an external power supply.

The irreversible transformer, shown as the regenerative load 2 in FIG. 1, is an imaginary transformer which is able to transmit electrical energy from the primary to the secondary side but which is unable to transmit electrical energy from the secondary side to the primary side (i.e., this imaginary transformer is able to transmit electric power from the primary side to the secondary side). As actual devices, an SW (switching) power supply apparatus, a generator and a power amplifier have a function to operate as this irreversible transformer.

When the tested power supply 1 is connected to this regenerative load apparatus, electric power from the secondary side of the power supply 4 is supplied to the tested power supply 1, whereby electric power is diverged and supplied to both of the primary side of the regenerative load 2 and the basic load 3 from the tested power supply 1. The secondary side of the regenerative load 2 is connected to the secondary side of the power supply 4 in series, whereby electric power transmitted from the secondary side of the regenerative load 2 is fed to the tested power supply 1 in addition to the electric power from the secondary side of the power supply 4 (i.e., electric power is regenerated from the regenerative load 3 to the tested power supply 1).

Let it be assumed that electric power is not consumed at all by elements and parts other than the basic load 3 of this regenerative load apparatus. Further, let it be assumed that electric power is not consumed at all by the tested power supply 1.

When the tested power supply 1 is connected to this regenerative load apparatus, the following relationships are established among currents which flow to respective sections.

Since the winding ratio of the tested power supply 1 is A:1, a relationship between the primary side current (input current) I1 and the secondary side current (output current) I2 of the tested power supply 1 may be expressed as $I2 = A \cdot I1$.

Let it now be assumed that of the output current I2 of the tested power supply 1, a current inputted to the basic load 3 is IL. Since the winding ratio of the regenerative load 2 is B:1, the primary side current of the regenerative load 2 is (I2−IL) and the secondary side current of the regenerative load 2 is equal to the primary side current I1 of the tested power supply 1, a relationship between the primary side current I1 and the secondary side current I2 of the tested power supply 1 is established as $I1 = B \cdot (I2-IL)$ From the above-mentioned equations, the output current I2 of the tested power supply 1 can be calculated as:

$$I2 = (A \cdot B) \cdot (I2 - IL)$$

$$\therefore (A \cdot B - 1) \cdot I2 = (A \cdot B \cdot IL)$$

$$\therefore I2 = (A \cdot B \cdot IL)/(A \cdot B - 1) \quad \text{①}$$

From this equation ①, it is to be understood that an inequality of $A \cdot B > 1$ is a condition under which the regenerative load apparatus can operate with stability. In other words, if an inequality of $A \cdot B \leq 1$ is satisfied, then I2<0 is satisfied and a positive feedback gain$\geq 1$ is satisfied. As a consequence, the regenerative load apparatus is not able to operate with stability.

Then, in the load test, although the output current I2 of the tested power supply 1 should be increased or decreased until it reaches a target value, from the equation ①, there can be considered the following two methods (1) and (2) as methods of increasing or decreasing the output current I2 in this regenerative load apparatus.

(1): Under the condition in which the input current IL is made constant, $A \cdot B$ should be controlled. Although A is the current conversion ratio of the tested power supply 1 (ratio of the output current relative to the input current) and is the predetermined value, B is the current conversion ratio of the regenerative load 2, the value of B should be controlled.

(2) Under the condition in which $A \cdot B$ is constant, the input current IL should be controlled (i.e., the equivalent resistance value of the basic load 3 should be controlled).

The present invention is intended to overcome the shortcomings encountered in the related art particularly when the tested apparatus is the apparatus which outputs the large output current. Therefore, let us consider the case in which the output current I2 of the tested power supply 1 should be controlled.

According to the method (1), when the target value of the output current I2 is large, $A \cdot B$ should be made close to 1 and hence the value of B may be made approximately inverse relative to the value of A. If $1/(A \cdot B - 1) = G$ is set, then when the value of B is approximately inverse relative to the value of A, G becomes a sufficiently large value and $I2 \approx G \cdot IL$ is established from the equation ①. Specifically, the output current I2 of the tested power supply 1 becomes about G times as large as the input current IL of the basic load 3 (the output current I2 is increased considerably as relative to the input current IL).

Therefore, having paid a remarkable attention to electric power, electric power supplied from the tested power supply 1 to the regenerative load apparatus (load for the tested power supply 1) becomes approximately G times as large as the consumed power of the basic load 3 (this electric power becomes considerably larger than the consumed power of the basic load 3). As a consequence, since electric power of (G−1)/G which is most of the electric power supplied from the tested power supply 1 to the regenerative load apparatus is regenerated from the regenerative load 2 to the tested power supply 1, it may be sufficient that remaining electric power of 1/G (electric power equal to the consumed electric power of the basic load 3) may be supplied to the tested power supply 1 from the power supply 4.

Then, since the winding ratio of the power supply 4 is expressed as $1:(1-1/A \cdot B)$, the winding ratio of the power supply 4 may be controlled in unison with the value of B. When the value of B is approximately inverse relative to the value of A, from the equation ①, the winding ratio of the power supply 4 is given by the following equation:

$$1 - 1/(A \cdot B) = (A \cdot B - 1)/(A \cdot B)$$
$$= (A \cdot B \cdot IL)/(A \cdot B \cdot I2)$$
$$\approx 1/G$$

$$I2 = A \cdot B \cdot (I2 - IL)$$
$$\therefore 1:(1 - 1/A \cdot B) \approx G:1 \qquad ①$$

In this manner, a voltage which results from decreasing the voltage applied to the primary side to approximately 1/G may be applied to the tested power supply 1 from the secondary side of the power supply 4. Having paid a remarkable attention to the electric power, it is to be appreciated that electric power, which is approximately 1/G of the electric power supplied from the tested power supply 1 to the regenerative load apparatus (i.e., electric power equal to the electric power consumed in the basic load 3), may be supplied to the tested power supply 1 from the power supply 4.

Therefore, the electric power supplied to the tested power supply 1 from the power supply 4 becomes considerably smaller than electric power supplied from a suitable means such as a commercially-available power supply in the load test executed by the related-art load apparatus using the resistors or the semiconductors. As a consequence, since the load test can be executed at lesser electric charges, a cost of load test can be reduced.

In other words, since the electric power (load for the tested power supply 1) supplied from the tested power supply 1 to the regenerative load apparatus is considerably larger than the electric power supplied to the tested power supply 1 from the power supply 4, the load test can be executed in such a manner that a load of a magnitude very larger than the electric power supplied from the power supply 4 is applied to the tested power supply 1.

Moreover, since only part of the electric power supplied from the tested power supply 1 to the regenerative load apparatus is consumed by the regenerative load apparatus, the regenerative load apparatus produces heat which becomes considerably less intensive than that of the related-art load apparatus. Therefore, the load test can be executed under the condition in which the air-conditioning facilities or the cooling equipment are not operated within the facilities of the small spaces, and the regenerative load apparatus can be made compact in size. From these standpoints, the cost of the load test can be decreased and the preparations for the load test can be simplified.

Moreover, since the output current I2 of the tested power supply 1 can be increased up to the desired target value by controlling the current conversion ratio B of the regenerative load 2 and the winding ratio of the power supply 4 (output voltage of the power supply 4) in unison with each other, it is possible to effect the load tests on various tested apparatus (a plurality of kinds of tested apparatus whose output currents are different from each other in magnitude).

On the other hand, according to the method (2), when the target value of the secondary side current I2 is large, it is sufficient to increase the primary side current IL (i.e., the equivalent resistance value of the basic load 3 may be decreased). Also in this case, if A·B is fixed at a value close to 1, then there can be achieved effects equal to those achieved by the method (1).

Next, the present invention will further be described with reference to FIG. 2, in which case a tested power supply is a DC constant voltage power supply which is accompanied by a loss of electric power (the tested power supply consumes part of supplied electric power).

Figure 2:
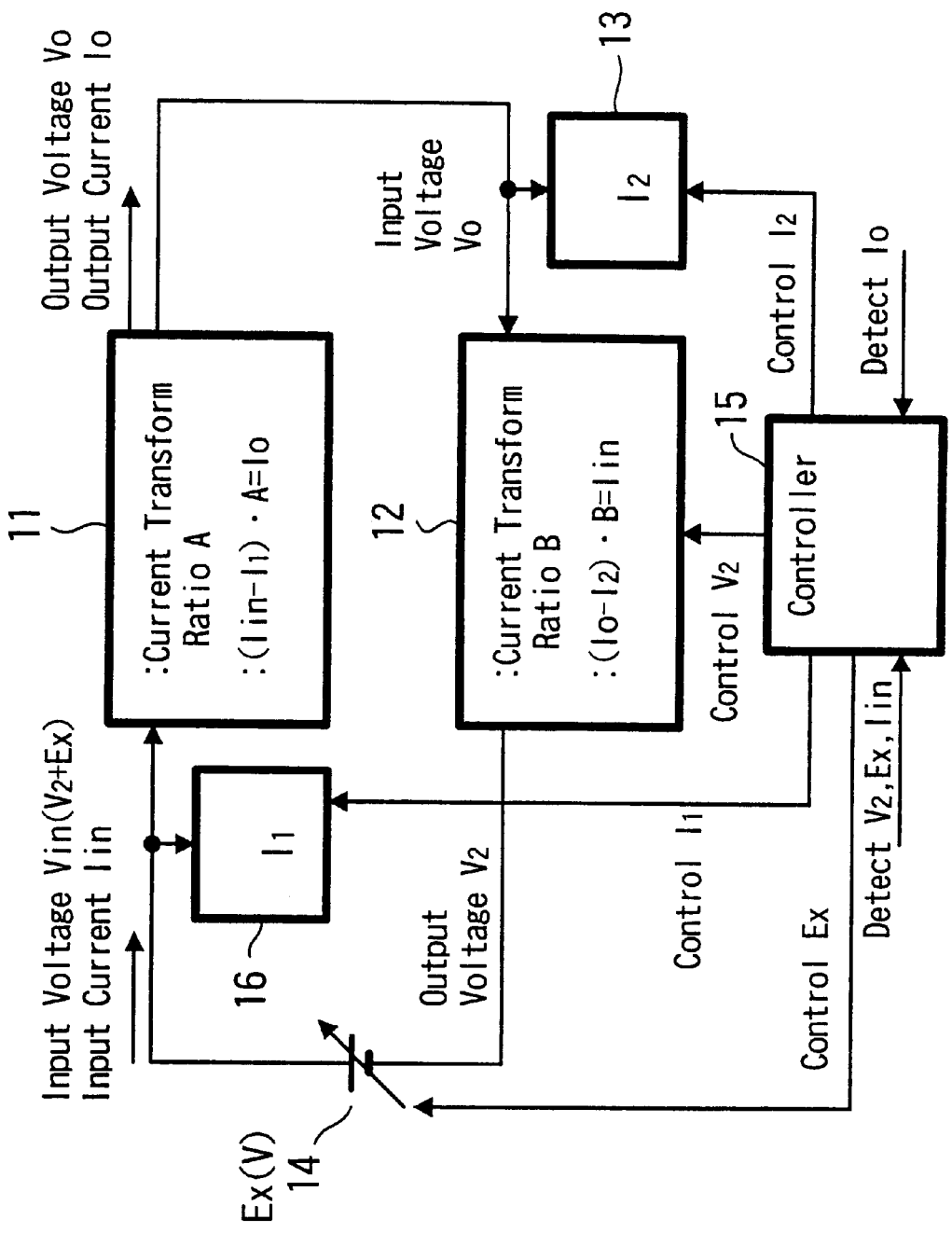
FIG. 2 is a circuit diagram of a tested power supply for explaining the present invention when the tested apparatus is a DC constant voltage power supply which is accompanied by a loss of electric power.

As shown in FIG. 2, a DC constant voltage power supply 1, which serves as a tested power supply, can be operated in response to an input voltage Vin, an input current Iin, an output voltage Vo and an output current Io.

In FIG. 2, a loss of electric power at the DC constant voltage power supply 11 is expressed in such a fashion that it is contained (electric power is not consumed at all in the DC constant voltage power supply 11) in a basic load 16 to which there is diverged and inputted part I1 (having a meaning different from the part I1 in FIG. 1) of the input current Iin at the input side of the DC constant voltage power supply 11.

Accordingly, since electric power supplied to the DC constant voltage power supply 11 and electric power transmitted from the DC constant voltage power supply 11 are equal to each other, an equality of Vin·(Iin−I1)=Vo·Io can be satisfied. Further, a current conversion ratio (ratio of an output current relative to an input current) A of the DC constant voltage power supply 11 can be expressed as (Iin−I1)·A=Io.

The basic load 16 may be comprised of only the loss of the electric power at the DC constant voltage power supply 11 or the basic load 16 may further contain a load such as a resistor which consumes electric power.

In FIG. 2, the DC constant voltage power supply 11 and elements and parts other than the electric power loss portion of the DC constant voltage power supply 11 in the basic load 16 constitute a regenerative load apparatus.

As shown in FIG. 2, this regenerative load apparatus includes a regenerative load 12 (first load) comprised of a DC constant voltage power supply or a power amplifier, a basic load 13 (second load) which consumes all of supplied electric power, a power supply 11 which can vary an output voltage and a controller 15.

When the DC constant voltage power supply 11 is connected to this regenerative load apparatus, electric power is supplied from the power supply 14 to the DC constant voltage power supply 11, whereby electric power is diverged and supplied to the regenerative load 12 and the basic load 13 from the DC constant voltage power supply 11. Since the output side of the regenerative load 12 is connected to the power supply 14 in series, an output voltage V2 of the regenerative load 12 is added to the output voltage Ex of the power supply 14 and then applied to the DC constant voltage power supply 11 and the basic load 16, whereby electric power transmitted from the regenerative load 2 is added to the electric power from the power supply 14 and supplied to the DC constant voltage power supply 11 (i.e., electric power is regenerated from the regenerative load 12 to the DC constant voltage power supply 11). Since the input voltage of the DC constant voltage power supply 11 is Vin, a relationship of Vin=V2+Ex is established between the output voltage V2 of the regenerative load 12 and the output voltage Ex of the power supply 14.

In FIG. 2, the loss of the electric power at the regenerative load 12 comprised of the DC constant voltage power supply or the power amplifier may be expressed in such a fashion that it may be contained in the basic load 13 (it is assumed that electric power is not consumed at all in the regenerative load 12 itself).

Accordingly, assuming now that a current inputted from the DC constant voltage power supply 11 to the basic load 13 is I2 (this current has a meaning different from the current 12 shown in FIG. 1), then since the electric power supplied to the regenerative load 12 and the electric power transmitted from the regenerative load 12 are equal to each other, a relationship of Vo·(Io−I2)=V2·Iin. Moreover, the current conversion ratio B of the regenerative load 12 may be expressed as (Io−I2)·B=Iin.

The basic load 13 also may be either comprised of only the electric power loss of the regenerative load 12 or may further contain a load such as a resistor for consuming electric power.

Detected results of the input current Iin, the output current Io, the output voltage V2 and the output voltage Ex are sent to the controller 15 from a detector, not shown. The controller 15 is adapted to control the output voltage V2 and the output voltage Ex based upon these detected results in unison with each other as will be described later on. Alternatively, the controller 15 is adapted to control a resistance value of a variable resistor when the basic load 12 or 16 includes the variable resistor (i.e., the controller 15 is adapted to control the current I2 or I1).

When the DC constant voltage power supply 11 is connected to this regenerative load apparatus, since relationships of (Iin−I1)·A=Io and (Io−I2)·B=Iin are established as mentioned before, from these equations, the output current Io of the DC constant voltage power supply Io may be calculated as follows:

$$Io = [(Io - I2) \cdot B - I1] \cdot A$$
$$= Io \cdot A \cdot B - I2 \cdot A \cdot B - I1 \cdot A$$

$$\therefore Io = (A \cdot B \cdot I2 + A \cdot I1)/(A \cdot B - 1) \quad \text{③}$$

A study of this equation ③ reveals that the inequality of A·B>1 is a condition in which the regenerative load apparatus can be operated with stability. In other words, if a relationship of A·B≦1 is established, then since an inequality of Io<0 is satisfied and hence an inequality of positive feedback gain≧1 is satisfied, the regenerative load apparatus cannot be operated with stability.

Then, in the load test, although the output current Io of the DC constant voltage power supply 11 has to be increased or decrease to a target value, from the above-mentioned equation ③, there may be considered the following two methods (3) and (4) for setting the output current Io to the target value in this regenerative load apparatus.

(3): Under the condition in which the currents I1 and I2 are made constant, A·B should be controlled. Although A represents the current conversion ratio of the DC constant voltage power supply 11 and is held at a predetermined value, B represents the current conversion ratio of the regenerative load 12 so that the value of B should be controlled; and (4): Under the condition in which A−B is made constant, the current I1 or I2 may be controlled (i.e., a resistance value of a portion of a variable resistor of the basic load 13 or 16 may be controlled).

The present invention is intended to overcome the shortcomings encountered in the related art particularly when the tested apparatus is the apparatus which outputs the large output current. Therefore, let us consider the case in which the output current should be increased.

According to the method (3), when the target value of the output current Io is large, since A·B should be made close to 1, the value of B may be made approximately inverse relative to the value of A.

If 1/(A·B−1)=G is set, then when the value of B is approximately inverse relative to the value of A, G may take a sufficiently large value. At the same time, Io≈G·(I2+A·I1) should be established from the above-mentioned equation ③. Since A·I1 may be regarded as a value which results from changing the input current to the basic load 16 (current of the loss at the input side of the DC constant voltage power supply 11) into the output side, (I2+A·I1) becomes a total of input currents to the basic load at the output side of the DC constant voltage power supply 11 (loss of the output side current of the DC constant voltage power supply 11). Specifically, the output current Io of the DC constant voltage power supply 11 becomes about G times as large as the input current to the basic load at the output side of the DC constant voltage power supply 11 (i.e., the output current Io may become considerably larger than the input current to this basic load).

Accordingly, having paid an attractive attention to electric power, it is to be understood that the electric power supplied from the DC constant voltage power supply 11 to the regenerative load apparatus (load for the DC constant voltage power supply 11) becomes approximately G times as large as the electric power consumed by the basic load at the output side of the DC constant voltage power supply 11 (i.e., this electric power may become considerably larger than the electric power consumed at this basic load). As a consequence, since (G−1)/G, which is most of the electric power supplied from the DC constant voltage power supply 11 to the regenerative load apparatus is regenerated to the tested power supply 1 from the regenerative load 12, it is sufficient that remaining 1/G (electric power equal to the electric power consumed by the basic load at the output side of the DC constant voltage power supply 11) may be supplied to the DC constant voltage power supply 11 from the power supply 14.

As a specific controlled object, since the current conversion ratio B of the regenerative load 12 is a reciprocal number of the voltage conversion ratio of the regenerative load 12, if B is determined, then the output voltage V2 of the regenerative load 12 is determined. If the output voltage V2 is determined, then the output voltage Ex required by the power supply 14 is determined. Therefore, it is sufficient that the output voltage V2 and the output voltage Ex may be controlled in unison with each other.

As a control procedure, when the power switch of the regenerative load apparatus is turned on, under control of the controller 15, the output voltage V2 of the regenerative load 12 is set to 0 (the current conversion ratio B of the regenerative load 12 is maximized) and the output voltage Ex of the power supply 14 is set to Vin so that all of electric power may be supplied from the power supply 14. At that time, because no current is inputted to the regenerative load 12, the output current Io of the DC constant voltage power supply 1 becomes equal to the input current I2 to the basic load 13.

Thereafter, under control of the controller 15, the output voltage V2 is increased until B is decrease to a necessary value (value corresponding to the target value of the output current Io) and the output voltage Ex is decreased in unison therewith in such a manner that the input voltage Vin may be held at a constant voltage. As a result, the output current Io of the DC constant voltage power supply 11 is increased up to the target value.

When the output current Io reaches the target value, the voltage which results from decreasing the output voltage, which is obtained during power-on time, to approximately 1/G is applied to the DC constant voltage power supply 11 from the power supply 14. Having paid attention to the electric power, it is to be understood that electric power (electric power equal to electric power consumed by the basic load at the output side of the DC constant voltage power supply 11) of approximately 1/G of the electric power supplied from the DC constant voltage power supply 11 to the regenerative load apparatus may be supplied to the DC constant voltage power supply 11.

Accordingly, the electric power supplied to the DC constant voltage power supply 11 from the power supply 14 becomes considerably smaller than the electric power supplied from a suitable means such as a commercially-available power supply required when a load test is effected by the load apparatus using the resistor or the semiconductor according to the related art. In consequence, since the load test can be executed at lesser electric charges, it is possible to decrease the cost of the test.

In other words, since the electric power (load for the DC constant voltage power supply 11) supplied from the DC constant voltage power supply 11 to the regenerative load apparatus is considerably larger than the electric power supplied to the DC constant voltage power supply 11 from the power supply 14, the load test can be executed under the condition in which a load of a magnitude considerably larger than the electric power supplied from the power supply 14 is applied to the DC constant voltage power supply 11.

Moreover, since only part of the electric power supplied from the DC constant voltage power supply 11 to the regenerative load apparatus is consumed by the regenerative load apparatus, the regenerative load apparatus may produce heat which is less intensive than that of the related-art load apparatus. Accordingly, since the load test can be executed without operating the air-conditioning facilities or the cooling equipment within the facilities of small spaces and the regenerative apparatus can be made compact in size, the cost of the load test can be decreased and the preparations for the load test can be simplified from these standpoints.

Furthermore, since the output current Io of the DC constant voltage power supply 11 can be increased up to the desired target value by controlling the current conversion ratio B (output voltage V2) of the regenerative load 12 and the output voltage Ex of the power supply 14 in unison with each other, it is possible to effect the load test on a variety of DC constant voltage power supplies (a plurality of kinds of DC constant voltage power supplies whose magnitudes of output currents are different from each other).

On the other hand, when the target value of the output current Io is large, it is sufficient that the current I1 or I2 may be increased (i.e., the resistance value at the portion of the variable resistor of the basic load 13 or 16 maybe decreased). Also in this case, when A·B is fixed at a value close to 1, there can be obtained effects equal to those achieved by the method (3).

At the end, an example in which the present invention is applied to a load test of a specific DC switching power supply will be described with reference to FIG. 3.

A DC SW (switching) power supply 21, which serves as a tested power supply, is able to afford an input: DC 140V×4 A (ampere)=560 W, an output: DC 24V×21 A (ampere)=504 W and an efficiency of 504/560=90%.

Figure 3:
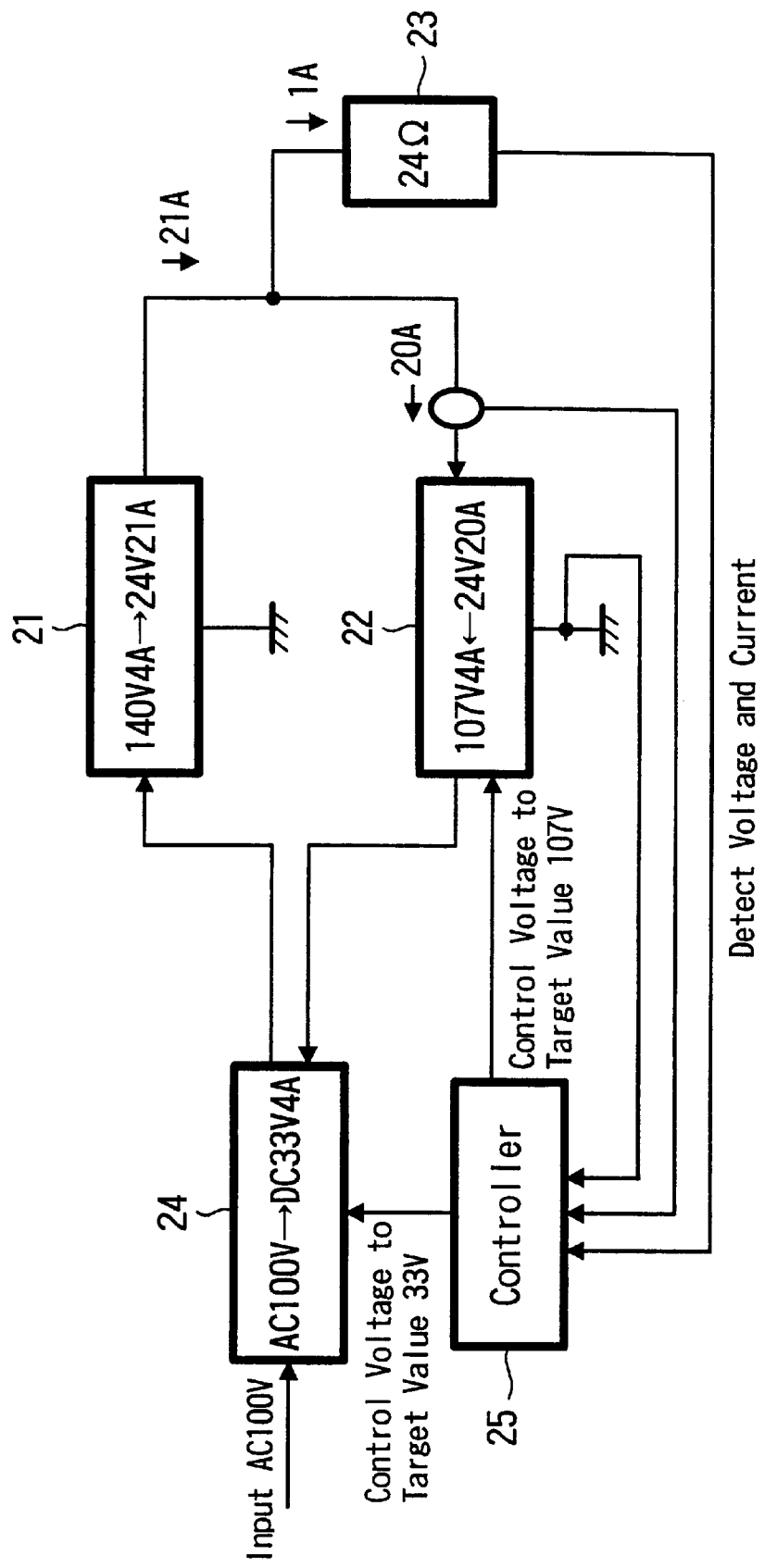
FIG. 3 is a circuit diagram showing an embodiment in which the present invention is applied to a load test of a DC switching power supply in actual practice.

In FIG. 3, elements and parts other than the DC SW power supply 21 constitute a regenerative load apparatus. As shown in FIG. 3, this regenerative load apparatus includes a DC SW power supply 22 having an efficiency of 89% and which serves as a regenerative load, a resistor 23 having a resistance of 24 Ω, an SW power supply 24 (power supply) for transforming an AC voltage of 100V, supplied from a commercially-available power supply, into a DC voltage and a controller 25.

When the DC SW power supply 21 is connected to this regenerative load apparatus, electric power is supplied from the SW power supply 24 to the DC SW power supply 21, whereby electric power is diverged and supplied to the DC SW power supply 22 and the resistor 23 from the DC SW power supply 21. Since the output side of the DC SW power supply 22 is connected to the power supply 24 in series, the output voltage of the DC SW power supply 22 is added to the output voltage of the power supply 24 and then applied to the DC SW power supply 21, whereby the electric power transmitted from the DC SW power supply 22 is added to the electric power from the SW power supply 24 and then supplied to the DC SW power supply 21 (i.e., electric power is regenerated from the DC SW power supply 22 serving as the regenerative load to the DC SW power supply 21 serving as the tested power supply).

Detected results of an input voltage to the DC SW power supply 22, an input current to the DC SW power supply 22 and an input current to the resistor 23 are sent to the controller 25 from a detector, not shown.

The controller 25 is adapted to control the output voltage of the DC SW power supply 22 and the output voltage of the SW power supply 24 in unison with each other based upon these detected results, as will be described later on.

Since the current conversion ratio (ratio of an output current relative to an input current) A of the DC SW power supply (tested power supply) 21 is a reciprocal number of a voltage conversion ratio (ratio of an output voltage relative to an input voltage), an equality of $A=140/25=5.833$ may be established.

Further, since the electric power consumed by the DC SW power supply 21 itself is calculated as $560-504=56$ W and $A \cdot I1$ in the aforementioned equation ③ is such one which results from converting this consumed electric power into a current obtained at the output side of the DC SW power supply 21, an equality of $A \cdot I1 = 56\ W/24V = 2.33$ A (ampere) may be satisfied.

Furthermore, since the input voltage of the DC SW power supply (regenerative load) 22 becomes 24V, the input current of the DC SW power supply 22 obtained when the output current of the DC SW power supply 21 is held at 21 A (ampere) is expressed as $21-1=20$ A (ampere) and the efficiency of the DC SW power supply 22 is 89%, the electric power consumed by the DC SW power supply 22 at that time may be expressed as $24V \times 20$ A (ampere)$\times(1-0.89) = 53$ W. Since I2 in the aforementioned equation ③ is a sum of a current converted amount which results from converting this consumed electric power 53 at the input side of the DC SW power supply 22 and the input current to the resistor 23, there may be established an equality of $I2 = 53\ W/24V + 1 = 3.17$ A (ampere).

In this manner, since $A=5.833$, $A \cdot I1=2.33$ and $I2=3.17$ are established, if these values and the target value 21 A (ampere) of the output current of the DC SW power supply 21 are substituted into the aforementioned equation ③, the current conversion ratio B of the DC SW power supply 22 may be obtained as follows:

$$21 = (5.833 \cdot B \cdot 3.17 + 2.33)/(5.833B - 1)$$
$$\therefore B = 0.2243 \qquad ④$$

When the current conversion ratio B of the DC SW power supply 22 is 0.2243, the output voltage of the DC SW power supply 22 may be given as $24/0.2243 = 107V$ and the output voltage of the SW power supply 24 may be given as $140-107 = 33V$.

As a control procedure, when the regenerative load apparatus is energized, under control of the controller 25, the output voltage of the DC SW power supply (regenerative load) 22 is set to 0V (the current conversion ratio B of the DC SW power supply 22 is maximized) and the output voltage of the SW power supply 24 is se to 140V, whereby all of electric power may be supplied from the SW power supply 24. At that time, since a current is not inputted to the DC SW power supply 22 at all, the output current of the DC SW power supply (tested power supply) 21 may become equal to an input current 1 A (ampere) to the resistor 23.

Thereafter, under control of the controller 25, the output voltage of the DC SW power supply (regenerative load) 22 is increased up to 107V (i.e., the current conversion ratio B is decreased to 0.2243). At the same time, the output voltage of the SW power supply 24 is decreased to 33V in unison with the above-mentioned output voltage in such a manner the input voltage to the DC SW power supply (tested power supply) 21 may be held at 140V. Consequently, the output current of the DC SW power supply 21 is increased up to the target value 21 A (ampere).

The value of this output current has to be monitored constantly after the output current of the DC SW power supply 21 has reached the target value 21 A (ampere). Then, when the value of this output current increases in excess of the target value 21 A (ampere), the output voltage of the DC SW power supply (regenerative load) 22 is decreased and the output voltage of the SW power supply 24 is increased. When, on the other hand, the value of this output current becomes less than the target value 21 A (ampere), the value of the above output current may be prevented from deviating from the target value 21 A (ampere) by increasing the output voltage of the DC SW power supply 22 and by decreasing the output voltage of the SW power supply 24.

As a consequence, only by supplying electric power of 33V×4 A (ampere)=132 W (sum of a loss amount 56 W of the DC SW power supply 21 itself, a loss amount 53 W at the DC SW power supply 22 as the regenerative load and a loss amount of 24 W at the resistor 23) from the SW power supply 24 to the DC SW power supply 21 (tested power supply), the load test (full-load test of the DC SW power supply 21) may be executed under the condition in which a load of 504 W is applied to the DC SW power supply 21.

Since the electric power of 132 W is approximately 0.26 times as large as 540 W and 1/G=(A·B−1)=(5.833×0.2243−1)≈0.3, the electric power supplied to the DC SW power supply 21 is approximately 1/G of the output electric power of the DC SW power supply 21.

When, on the other hand, the full-load test is effected on this DC SW power supply 21 by the related-art load apparatus, all of the output electric power 504 W of the DC SW power supply 21 is consumed by the load (resistor or semiconductor).Therefore, electric power of 560 W, which is a sum of the loss electric power 504 W at this load and the loss electric power 56 W at the DC SW power supply 21 has to be supplied to the DC SW power supply 21 from a suitable means such as a commercially-available power supply.

As described above, the electric power that should be supplied to the DC SW power supply 21 can be decreased very much as relative to the related art.

While the present invention has been described so far on the assumption that the tested apparatus is the power supply apparatus, the present invention is not limited thereto. That is, even when the tested apparatus is a power amplifier, excepting that the output of the power amplifier should be rectified and inputted to the regenerative load, the load test can be executed similarly to the case in which the tested apparatus is the power supply apparatus.

As described above, according to the present invention, when a load test is effected on a tested apparatus such as a power supply apparatus or a power amplifier for supplying electric power to a load, electric power supplied from the power supply to the tested apparatus can be decreased considerably. As a result, since the load test can be executed by lesser electric charges, the cost of the load test can be decreased.

Further, since the regenerative load tested apparatus according to the present invention produces heat which is less intensive than that of the related-art load tested apparatus due to the consumption of electric power, the load test can be made without operating the air-conditioning facilities and the cooling equipment in the facilities of the small spaces, and the load tested apparatus can be made small in size. Therefore, from this standpoint, the cost of the load test can be decreased and the preparations for the load test can be simplified.

Furthermore, since the output current of the tested apparatus can be increased up to the desired target value, the load test can be effected on a variety of tested apparatus (a plurality of kinds of tested apparatus whose output currents are different from each other in magnitude).

Having described a preferred embodiment of the invention with reference to the accompanying drawings, it is to be understood that the invention is not limited to that precise embodiment and that various changes and modifications could be effected therein by one skilled in the art without departing from the spirit or scope of the invention as defined in the appended claims.

What is claimed is:

1. In a load apparatus for testing an apparatus, which supplies electric power to a load, as a tested apparatus, a regenerative load apparatus comprising:

a first load for transmitting supplied electric power from an output side at a current conversion ratio approximately inverse relative to that of said tested apparatus;

a second load for consuming supplied electric power; and a power supply for supplying electric power approximately equal to electric power consumed by said second load to said tested apparatus, wherein
   electric power is diverged and supplied to said first and second loads from said tested apparatus and the electric power transmitted from said first load is supplied to said tested apparatus in addition to the electric power from said power supply.

2. In a load apparatus for testing an apparatus, which supplies electric power to a load, as a tested apparatus, a regenerative load apparatus comprising:

a first load for transmitting supplied electric power from an output side and whose current conversion ratio can be varied;

a second load for consuming supplied electric power;

a power supply for supplying electric power to said tested apparatus and whose output voltage can be varied; and control means for controlling the current conversion ratio of said first load and the output voltage of said power supply in unison with each other, wherein
   electric power is diverged and supplied to said first and second loads from said tested apparatus and the electric power transmitted from said first load is supplied to said tested apparatus in addition to the electric power from said power supply.

3. In a load apparatus for testing an apparatus, which supplies electric power to a load, as a tested apparatus, a regenerative load apparatus comprising:

a first load for transmitting supplied electric power from an output side;

a second load for consuming supplied electric power and whose equivalent resistance value can be varied;

a power supply for supplying electric power to said tested apparatus; and control means for controlling the equivalent resistance value of said second load, wherein electric power is diverged and supplied to said first and second loads from said tested apparatus and the electric power transmitted from said first load is supplied to said tested apparatus in addition to the electric power from said power supply.

4. A regenerative load apparatus according to claim 1, wherein said first load is a switching power supply.

5. A regenerative load apparatus according to claim 2, wherein said first load is a switching power supply.

6. A regenerative load apparatus according to claim 3, wherein said first load is a switching power supply.

7. A regenerative load apparatus according to claim 1, wherein said first load is a power amplifier.

8. A regenerative load apparatus according to claim 2, wherein said first load is a power amplifier.

9. A regenerative load apparatus according to claim 3, wherein said first load is a power amplifier.

10. In a method of effecting a load test on a tested apparatus which is an apparatus for supplying electric power to a load, a load test method comprising the steps of:

diverging and supplying electric power to a first load, which transmits supplied electric power from an output side, and a second load, which consumes supplied electric power, from said tested apparatus;

supplying the electric power transmitted from said first load to said tested apparatus in addition to electric power from a power supply; and controlling a current conversion ratio of said first load and an output voltage of said power supply in unison with each other.

11. In a method of effecting a load test on a tested apparatus which is an apparatus for supplying electric power to a load, a load test method comprising the steps of:

diverging and supplying electric power to a first load, which transmits supplied electric power from an output side, and a second load, which consumes supplied electric power, from said tested apparatus;

supplying the electric power transmitted from said first load to said tested apparatus in addition to electric power from a power supply; and controlling an equivalent resistance value of said second load.

12. A load test method according to claim 10, wherein said first load is a switching power supply.

13. A load test method according to claim 11, wherein said first load is a switching power supply.

14. A load test method according to claim 10, wherein said first load is a power amplifier.

15. A load test method according to claim 11, wherein said first load is a power amplifier.

* * * * *